(12) United States Patent
Yuan et al.

(10) Patent No.: US 7,763,477 B2
(45) Date of Patent: Jul. 27, 2010

(54) FABRICATION OF SEMICONDUCTOR DEVICES

(75) Inventors: Shu Yuan, Singapore (SG); Xuejun Kang, Singapore (SG)

(73) Assignee: Tinggi Technologies Pte Limited, Singapore (SG)

( * ) Notice: Subject to any disclaimer, the term of this patent is extended or adjusted under 35 U.S.C. 154(b) by 406 days.

(21) Appl. No.: 10/593,107

(22) PCT Filed: Mar. 1, 2005

(86) PCT No.: PCT/SG2005/000061
§ 371 (c)(1),
(2), (4) Date: Oct. 25, 2007

(87) PCT Pub. No.: WO2005/088743
PCT Pub. Date: Sep. 22, 2005

(65) Prior Publication Data
US 2008/0128722 A1  Jun. 5, 2008

(30) Foreign Application Priority Data
Mar. 15, 2004  (SG) .............................. 200401424-7

(51) Int. Cl.
*H01L 21/00* (2006.01)
*H01L 27/15* (2006.01)
*H01L 31/12* (2006.01)
*H01L 33/00* (2006.01)

(52) U.S. Cl. ......................... 438/22; 438/29; 257/79; 257/E33.001; 257/E21.053

(58) Field of Classification Search .................. 438/22, 438/23, 24, 29; 257/79, 80, 82, 83, E21.053, 257/E33.001
See application file for complete search history.

(56) References Cited

U.S. PATENT DOCUMENTS

| 4,107,720 A | 8/1978 | Pucel et al. |
| 5,192,987 A | 3/1993 | Khan et al. |
| 5,405,804 A | 4/1995 | Yabe |
| 5,654,228 A | 8/1997 | Shieh et al. |

(Continued)

FOREIGN PATENT DOCUMENTS

CN  1373522 A  10/2002

(Continued)

OTHER PUBLICATIONS

Chu, Chen F., et al., "Comparison of p-Side Down and p-Side Up GaN Light-Emitting Diodes Fabricated by Laser Lift-Off", *Japan Journal of Applied Physics*, vol. 42, (Feb. 15, 2003), 147-150.

(Continued)

*Primary Examiner*—Hoai V Pham
(74) *Attorney, Agent, or Firm*—Blakely, Sokoloff, Taylor & Zafman LLP

(57) ABSTRACT

A method for fabrication of a semiconductor device, the semiconductor device having a plurality of epitaxial layers on a substrate. The plurality of epitaxial layers include an active region in which light is able to be generated. The method comprises applying at least one first ohmic contact layer to a front surface of the epitaxial layer, the first ohmic contact layer also acting as a reflector. The substrate is then remove from a rear surface of the epitaxial layers. The rear surface is then textured.

41 Claims, 7 Drawing Sheets

U.S. PATENT DOCUMENTS

| | | | |
|---|---|---|---|
| 6,091,085 A | 7/2000 | Lester | |
| 6,169,297 B1 | 1/2001 | Jang et al. | |
| 6,210,479 B1 | 4/2001 | Bojarczuk et al. | |
| 6,303,405 B1 | 10/2001 | Yoshida et al. | |
| 6,307,218 B1 | 10/2001 | Steigerwald et al. | |
| 6,365,429 B1 | 4/2002 | Kneissl et al. | |
| 6,420,242 B1 | 7/2002 | Cheung et al. | |
| 6,420,732 B1 | 7/2002 | Kung et al. | |
| 6,426,512 B1 | 7/2002 | Ito et al. | |
| 6,448,102 B1 | 9/2002 | Kneissl et al. | |
| 6,492,661 B1 | 12/2002 | Chien et al. | |
| 6,562,648 B1 | 5/2003 | Wong et al. | |
| 6,573,537 B1 | 6/2003 | Steigerwald et al. | |
| 6,627,921 B2 | 9/2003 | Wong et al. | |
| 6,649,437 B1 | 11/2003 | Yang et al. | |
| 6,677,173 B2 | 1/2004 | Ota | |
| 6,821,804 B2 | 11/2004 | Thibeault et al. | |
| 7,338,822 B2 * | 3/2008 | Wu et al. | 438/26 |
| 2001/0055324 A1 | 12/2001 | Ota | |
| 2002/0022286 A1 | 2/2002 | Nikolaev et al. | |
| 2002/0034835 A1 | 3/2002 | Chen et al. | |
| 2002/0093023 A1 | 7/2002 | Camras et al. | |
| 2002/0113279 A1 | 8/2002 | Hanamaki et al. | |
| 2002/0117681 A1 | 8/2002 | Weeks et al. | |
| 2002/0134985 A1 | 9/2002 | Chen et al. | |
| 2002/0137243 A1 | 9/2002 | Chen et al. | |
| 2002/0179910 A1 | 12/2002 | Slater, Jr. | |
| 2003/0038284 A1 | 2/2003 | Kurahashi et al. | |
| 2003/0064535 A1 | 4/2003 | Kub et al. | |
| 2003/0111667 A1 | 6/2003 | Schubert | |
| 2003/0151357 A1 | 8/2003 | Uemura | |
| 2003/0189215 A1 | 10/2003 | Lee et al. | |
| 2004/0026709 A1 | 2/2004 | Bader et al. | |
| 2004/0065889 A1 | 4/2004 | Ueda et al. | |
| 2004/0104395 A1 | 6/2004 | Hagimoto et al. | |
| 2004/0110395 A1 | 6/2004 | Ueda et al. | |
| 2004/0130037 A1 | 7/2004 | Mishra et al. | |
| 2004/0235210 A1 | 11/2004 | Tamura et al. | |
| 2005/0014303 A1 | 1/2005 | Tsai et al. | |
| 2005/0026399 A1 | 2/2005 | Chien et al. | |
| 2005/0035354 A1 | 2/2005 | Lin et al. | |
| 2005/0082555 A1 | 4/2005 | Chien et al. | |
| 2005/0087884 A1 | 4/2005 | Stokes et al. | |
| 2005/0093002 A1 | 5/2005 | Tsai et al. | |
| 2005/0098792 A1 | 5/2005 | Lee et al. | |
| 2005/0127397 A1 | 6/2005 | Borges et al. | |
| 2005/0164482 A1 | 7/2005 | Saxler | |
| 2006/0099730 A1 | 5/2006 | Lee et al. | |
| 2006/0124939 A1 | 6/2006 | Lee et al. | |
| 2006/0151801 A1 | 7/2006 | Doan et al. | |
| 2006/0154390 A1 | 7/2006 | Tran et al. | |
| 2006/0154391 A1 | 7/2006 | Tran et al. | |
| 2006/0154392 A1 | 7/2006 | Tran et al. | |
| 2006/0154393 A1 | 7/2006 | Doan et al. | |
| 2006/0157721 A1 | 7/2006 | Tran et al. | |
| 2006/0163586 A1 | 7/2006 | Denbaars et al. | |
| 2006/0186418 A1 | 8/2006 | Edmond et al. | |
| 2007/0029541 A1 | 2/2007 | Xin et al. | |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| JP | 59-112667 | 6/1984 |
| JP | 05-291621 | 11/1993 |
| JP | 10-117016 | 5/1998 |
| JP | 2000-183400 | 6/2000 |
| JP | 2000-277804 | 10/2000 |
| JP | 2000-294837 | 10/2000 |
| JP | 2001-036129 | 2/2001 |
| JP | 2001-049491 | 2/2001 |
| JP | 2001-168387 | 6/2001 |
| JP | 2001-237461 | 8/2001 |
| JP | 2001-313422 | 11/2001 |
| JP | 2003-303743 | 10/2003 |
| JP | 2003-347590 | 12/2003 |
| JP | 2004-072052 | 3/2004 |
| JP | 2004-088083 | 3/2004 |
| JP | 2005-012188 | 1/2005 |
| JP | 2005-236048 | 9/2005 |
| JP | 2006-253647 | 9/2006 |
| KR | 10-2002-079659 | 10/2002 |
| SG | 200401964-2 | 4/2004 |
| SG | 200506301-1 | 9/2005 |
| SG | 200506897-8 | 10/2005 |
| SG | 200508210-2 | 12/2005 |
| SG | 200605500-8 | 8/2006 |
| SG | 200606050-3 | 9/2006 |
| TW | 419836 B | 1/2001 |
| TW | 475276 B | 2/2002 |
| TW | 540171 | 7/2003 |
| WO | WO 01/47039 A1 | 6/2001 |
| WO | WO 2004/102686 A1 | 11/2004 |
| WO | WO 2005/029572 A1 | 3/2005 |
| WO | WO 2005/029573 A1 | 3/2005 |
| WO | WO 2005/064666 A1 | 7/2005 |
| WO | WO 2005/088743 A1 | 9/2005 |
| WO | WO 2005/098974 A1 | 10/2005 |
| WO | WO 2007/046773 A1 | 4/2007 |
| WO | WO 2007/037762 A1 | 5/2007 |
| WO | WO 2007/073354 A1 | 6/2007 |
| WO | WO 2008/020819 A1 | 2/2008 |
| WO | WO 2008/030188 A1 | 3/2008 |

OTHER PUBLICATIONS

Li, W H., et al., "Electrochemical deposition of Copper on patterned Cu/Ta(N)SiO2 surfaces for super filling of sub-micron features", *Journal of Applied Electrochemistry*, vol. 31, (2001), 1395-1397.

Ueda, Tetsuzo et al., "Vertical InGaN-based blue light emitting diode with plated metal base fabricated using laser lift-off technique," Phys. Stat. Sol.(c) 0, No. 7, Oct. 20, 2003, pp. 2219-2222, Wiley-VCH Verlag GmbH & Co., KGaA, Weinhem, 2003.

M.K. Kelly, et at, "Optical Process for Liftoff of Group III-Nitride Films," Physica Status Solidi (a), vol. 159, Issue 1, pp. R3-R4, (Nov. 28, 1996).

Zhifang Fan, et al., "Very Low Resistance Multilayer Ohmic Contact to $n$-GaN," Applied Physics Letters, vol. 68, Issue 12, pp. 1672-1674, (Mar. 18, 1996).

I. Schnitzer, et al., "30% External Quantum Efficiency from Surface Textured, Thin-Film Light-Emitting Diodes,"Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the $p$-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P$/GaP Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAIP and GaAs: Comparison of Transparent- and Loss- Type Structures," Journal of Applied Physics, Vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report, 3 pgs., (Dec. 9, 2003).

PCT International Search Report for PCT Counterpart Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Application No. PCT/SG2006/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Application No. PCT/SG2006/000395 containing Communication relating to the Results of the Partial International Search Report, 3 pgs., (Feb. 26, 2007).

PCT International Search Report for PCT Application No. PCT/SG2007/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

* cited by examiner

FABRICATION OF SEMICONDUCTOR DEVICES

CROSS-REFERENCE TO OTHER APPLICATIONS

This is a National Phase of International Application No. PCT/SG2005/000061, filed on Mar. 1, 2005, which claims priority from Singaporean Patent Application No. 200401424-7 filed on Mar. 15, 2004.

FIELD OF THE INVENTION

The present invention relates to the fabrication of semiconductor devices and refers particularly, though not exclusively, to the fabrication of semiconductor light emitting diodes (LEDs) with surface texturing for improved light output.

DEFINITIONS

Throughout this specification optoelectronic device includes light emitting diodes ("LEDs") and laser diodes.

Throughout this specification reference to GaN devices such as, for example, GaN LEDs, is to be taken as including a reference to all semiconductor devices made of GaN-related materials, including, but not limited to, GaN, AlGaN, InGaN, AlGaInN, and so forth.

BACKGROUND TO THE INVENTION

The majority of current semiconductor devices are made from semiconductor materials based on silicon (Si), gallium arsenide (GaAs), and indium phosphide (InP). Compared to such electronic and optoelectronic devices, GaN devices have many advantages. The major intrinsic advantages that GaN has are summarised in Table 1:

TABLE 1

| Semi-conductor | Mobility μ (cm$^2$/Vs) | Band Gap (eV)/ wavelength (nm) | BFOM (power transistor merit) | Maximum Temperature (C.) |
|---|---|---|---|---|
| Si | 1300 | 1.1/1127 | 1.0 | 300 |
| GaAs | 5000 | 1.4/886 | 9.6 | 300 |
| GaN | 1500 | 3.4/360 | 24.6 | 700 |

BFOM: Baliga's figure of merit for power transistor performance
A shorter wavelength corresponds to a higher DVD/CD capacity.

From Table 1, it can be seen that GaN has the highest band gap (3.4 eV) among the given semiconductors. Thus, it is called a wide band gap semiconductor. Consequently, electronic devices made of GaN operate at much higher power than Si and GaAs and InP devices. Green, blue, and ultraviolet (UV) and white light emitting diodes (LEDs) can be made from GaN wafers.

For semiconductor lasers, GaN lasers have a relatively short wavelength. If such lasers are used for optical data storage, the shorter wavelength may lead to a higher capacity. GaAs lasers are used for the manufacture of CD-ROMs with a capacity of about 670 MB/disk. AlGaInP lasers (also based on GaAs) are used for the latest DVD players with a capacity of about 4.7 GB/disk. GaN lasers in the next-generation DVD players may have a capacity of 26 GB/disk.

GaN devices are made from GaN wafers that are typically multiple GaN-related epitaxial layers deposited on a sapphire substrate. The sapphire substrate is usually two inches in diameter and acts as the growth template for the epitaxial layers. Due to lattice mismatch between GaN-related materials (epitaxial films) and sapphire, defects are generated in the epitaxial layers. Such defects cause serious problems for GaN lasers and transistors and, to a lesser extent, for GaN LEDs.

There are two major methods of growing epitaxial wafers: molecular beam epitaxy (MBE), and metal organic chemical vapour deposition (MOCVD). Both are widely used.

Conventional LED fabrication processes usually include the major steps: photolithography, etching, dielectric film deposition, metallization, bond pad formation, wafer inspection/testing, wafer thinning, wafer dicing, chip bonding to packages, wire bonding and reliability testing.

Once the processes for making LEDs are completed at the full wafer scale, it is then necessary to break the wafer into individual LED chips or dice. For GaN wafers grown on sapphire substrates, this "dicing" operation is a major problem as sapphire is very hard. The sapphire first has to be thinned uniformly from about 400 microns to about 100 microns. The thinned wafer is then diced by diamond scriber, sawed by a diamond saw or by laser grooving, followed by scribing with diamond scribers. Scribing of the sapphire may be by use of an ultra violet ("UV") laser, but care must be taken to ensure the laser does not damage the GaN device. Such processes limit throughput, cause yield problems and consume expensive diamond scribers/saws.

Known LED chips grown on sapphire substrates require two wire bonds on top of the chip. This is necessary because sapphire is an electrical insulator and current conduction through the 100-micron thickness is not possible. Since each wire bond pad takes about 10-15% of the wafer area, the second wire bond reduces the number of chips per wafer by about 10-15% as compared to single-wire bond LEDs grown on conducting substrates. Almost all non-GaN LEDs are grown on conducting substrates and use one wire bond. For packaging companies, two wire bonding reduces packaging yield, requires modification of one-wire bonding processes, reduces the useful area of the chip, and complicates the wire bonding process.

Sapphire is not a good thermal conductor. For example, its thermal conductivity at 300 K (room temperature) is 40 W/Km. This is much smaller than copper's thermal conductivity of 380 W/Km. If the LED chip is bonded to its package at the sapphire interface, the heat generated in the active region of the device must flow through 3 to 4 microns of GaN and 100 microns of sapphire to reach the package/heat sink. For GaN LEDs on sapphire, the active region where light is generated is about 3 to 4 micron from the sapphire substrate. As a consequence, the chip will run hot affecting both performance and reliability.

In general, the external quantum efficiency of GaN LEDs is less than the internal quantum efficiency. If no special treatment is carried out on the chip to extract more light, the external quantum efficiency is a few percent, while the internal quantum efficiency can be as high as 99% (I. Schnitzer and E. Yablonovitch, C. Caneau, T. J. Gmitter, and A. Schere, Applied Physics Letters, Volume 63, page 2174, 18 Oct. 1993). This large discrepancy between the two quantum efficiencies is also true to other LEDs. Its origin is due to the light extraction efficiency of most conventional LEDs being limited by the total internal reflection of the generated light in the active region of the LED, which occurs at the semiconductor-air interface. This is due to the large difference in the refractive index between the semiconductor and air.

For GaN devices, the critical angle to enable the light generated in the active region to be able to escape is about 23°. Because the light emission from the active region of a LED is directionally isotropic, and the light can only escape from the chip if the angle of incidence to the chip wall (often the front surface of the LED chip) is less than the critical angle, a small fraction of light generated in the active region of the LED can escape to the surrounding environment (e.g. air). The escaping light is generally in a cone of light. FIG. 1 (not to scale) illustrates this escape cone concept. Therefore, for a conventional LED, the external quantum efficiency is limited to a few percent.

It is known that surface texturing can increase the light extraction efficiency significantly (e.g., I. Schnitzer and E. Yablonovitch, C. Caneau, T. J. Gmitter, and A. Schere, Applied Physics Letters, Volume 63, page 2174, 18 Oct. 1993), and it has been used in the fabrication of LEDs such as, for example, AlGaInP-based LEDs. In order to increase light-extraction efficiency from LEDs, it is very important that the photons generated within the LEDs experience multiple opportunities to find the escape cone or the surface is so modified that the generated light falls into new escape cones, as shown in the illustration of FIG. 2, which is a figure from Journal of Applied Physics, Volume 93, page 9383, 2003.

It has been suggested to improve the light output of an InGaN-based LED by using a microroughened p-GaN surface (i.e. the normal top or front surface), with metal clusters being used as a wet etching mask (Journal of Applied Physics 93, page 9383, 2003). The light-output efficiency of an LED structure with a microroughened surface was significantly increased compared to that of a conventional LED structure. For an LED with a p-GaN top surface that was microroughened, the angular randomization of photons can be achieved by surface scattering from the microroughened top surface of the LED. Thus, the microroughened surface structure can improve the probability of photons escaping to outside the LED, resulting in an increase in the light output power of the LED.

The technique of surface texturing, however, has only been applied to the front surface of the LED. The technique has difficulties in device fabrication, especially for GaN LEDs, where the layers above the active region are quite thin (about 300 nm), and etching of GaN is difficult. To texture the surface, patterns of depths of a few hundred nanometers are often generated by dry etching or wet etching on the surface. This poses considerable risk of possible damage to the active region, and thus may cause a significant deterioration in the performance of the device.

SUMMARY OF THE INVENTION

In accordance with a preferred form there is provided a method for fabrication of a semiconductor device, the semiconductor device having a plurality of epitaxial layers on a substrate, the plurality of epitaxial layers including an active region in which light is able to be generated; the method comprising:
(a) applying at least one first ohmic contact layer to a front surface of the epitaxial layer; the first ohmic contact layer also acting as a reflector;
(b) removing the substrate from a rear surface of the epitaxial layers; and
(c) texturing the rear surface.

Before the substrate is removed, a seed layer of a thermally conductive metal may be applied to the ohmic contact layer, and a relatively thick layer of the thermally conductive metal may be electroplated on the seed layer. The front surface may be coated with an adhesion layer, or a multiple layer stack, prior to application of the seed layer.

The seed layer may be patterned with photoresist patterns before the electroplating step (b), and the electroplating of the relatively thick layer may be between the photoresist patterns. The photoresist patterns may be of a height in the range 3 to 500 micrometers, and may have a thickness in the range 3 to 500 micrometers. The photoresist patterns may have a spacing in the range of 200 to 2,000 microns.

Before removing the substrate annealing may be performed to improve adhesion

The seed layer may be electroplated without patterning, patterning being performed subsequently. Patterning may be by photoresist patterning and then wet etching; or by laser beam micro-machining of the relatively thick layer.

The relatively thick layer may be of a height no greater that the photoresist height; or may be of a height greater than the photoresist and is subsequently thinned. Thinning may be by polishing or wet etching.

Step (c), i.e. the texturing of the rear surface, may be by standard patterning methods. For example, it may be by patterning the exposed rear surface and then etching. Etching may be by one or more of: dry etching, wet etching, photochemical etching, laser etching, or other suitable methods. The texturing may also be by photolithography followed by deposition of a layer on the exposed rear surface and then lift-off.

As taught by Huh et al (J. Appl. Phys. 93, page 9383, 2003), texturing may also be by depositing a thin metal film on the rear surface, and then rapid thermal annealing of the metal to form a cluster of metal drops which is then used as an etching mask for the surface texturing.

The shape and dimensions of the surface texturing may be varied as required or desired, depending on the design and/or process methods.

After removing the substrate, the rear surface may be etched (with or without patterning), and then the rear surface textured.

Alternatively, the surface texturing may be on a layer (or a stack of multiple layers) added to the rear surface after the substrate is removed.

After step (c), or between steps (b) and (c), there may be included an extra step of forming a second ohmic contact layer on the rear surface, the second ohmic contact layer being selected from the group consisting of: opaque, transparent, and semi-transparent. The second ohmic contact layer may be one of blank and patterned. Bonding pads may be formed on the second ohmic contact layer.

The exposed rear surface may be cleaned and etched before the second ohmic contact layer is deposited. The second ohmic contact layer may not cover the whole area of the rear surface. If the second ohmic contact layer covers large portion of the rear surface, step (c) may be formed directly on the second ohmic contact. In this way the patterned second ohmic contact layer serves as the textured surface.

The substrate may be patterned before the deposition of the epitaxial layers on the substrate. Therefore, after the removal of the substrate, the rear surface is already patterned and thus no subsequent rear surface texturing is required.

It is also possible to pattern or texture the layers below the active region during the deposition of the plurality of epitaxial layers. In this way the patterns are already in the layered structure before the substrate is removed, although the texture is not at the rear surface. Such patterning may improve the extraction efficiency of the LED after the substrate is removed.

After forming the second ohmic contact layer there may be included the testing of the semiconductor devices, and the step of separation into individual devices.

The semiconductor devices may be fabricated without one or more selected from the group consisting of: lapping, polishing and dicing.

The first ohmic contact may be on p-type layers of the epitaxial layers; and the second ohmic contact layer may be formed on n-type layers of the expitaxial layers.

After step (c), dielectric film(s) may be deposited on the epitaxial layers and openings cut in the dielectric films and second ohmic contact layer, and bond pads deposited on the epitaxial layers. Step (c) may be performed in the deposited dielectric film(s), instead of the rear surface.

After step (a), electroplating of a thermally conductive metal on the epitaxial layers may be performed. The thermally conductive metal may be copper, and the epitaxial layers may be multiple GaN-related layers.

In a further form there is provided a semiconductor device comprising epitaxial layers, first ohmic contact layers on a front surface of the epitaxial layer and providing a reflective surface, and a second ohmic contact layer on a rear surface of the epitaxial layers; the rear surface being surface textured.

A relatively thick layer of a thermally conductive metal may be provided on the first ohmic contact layer, there being a layer on the first ohmic contact layer between the first ohmic contact layer and the relatively thick layer. A seed layer of the thermally conductive metal may be applied to the adhesive layer. The relatively thick layer may be at least 20 micrometers thick. The layer may be an adhesive layer or a stack of multiple layers.

The second ohmic contact layer may be a thin layer in the range of from 3 to 500 nanometers; and may be selected from the group consisting of: opaque, transparent, and semi-transparent. The second ohmic layer may include bonding pads.

The thermally conductive metal may be copper, and the epitaxial layers may be multiple GaN-related epitaxial layers.

The semiconductor device may be a light emitting device, or a transistor device.

The second ohmic contact layer may be blank or patterned.

BRIEF DESCRIPTION OF THE DRAWINGS

In order that the invention may be better understood and readily put into practical effect there shall now be described by way of non-limitative example only a preferred embodiment of the present invention, the description being with reference to the accompanying illustrative (and not to scale) drawings in which.

DETAILED DESCRIPTION OF THE PREFERRED EMBODIMENT

Figure 12:
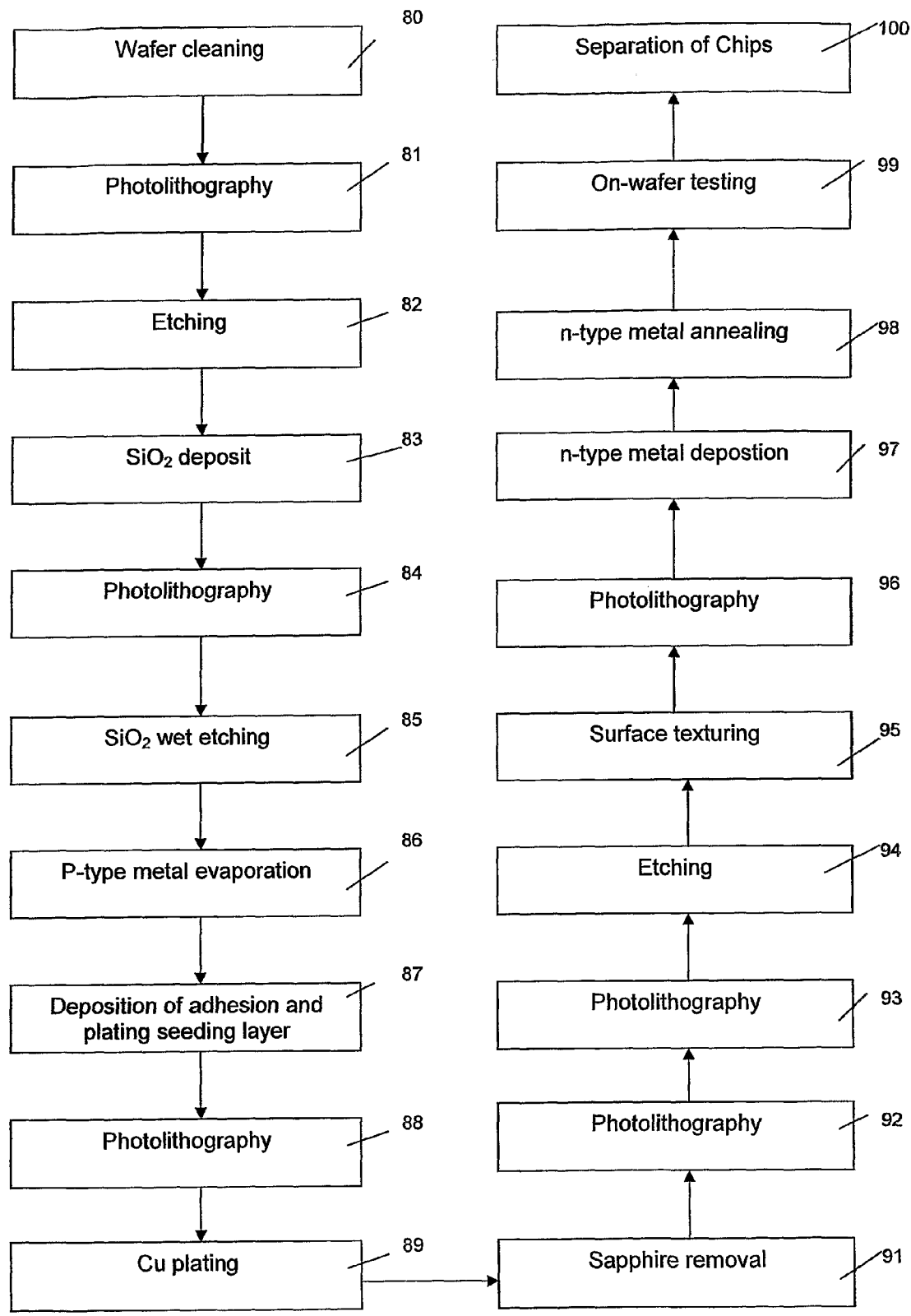
FIG. 12 is a flow chart of the process.

For the following description, the reference numbers in brackets refer to the process steps in FIG. 12. FIG. 12 is illustrative only and does not include all process steps that may be undertaken in a commercial situation, those steps not required for a full understanding of the invention having been deleted for the sake of simplifying the description of the process.

Figure 1:
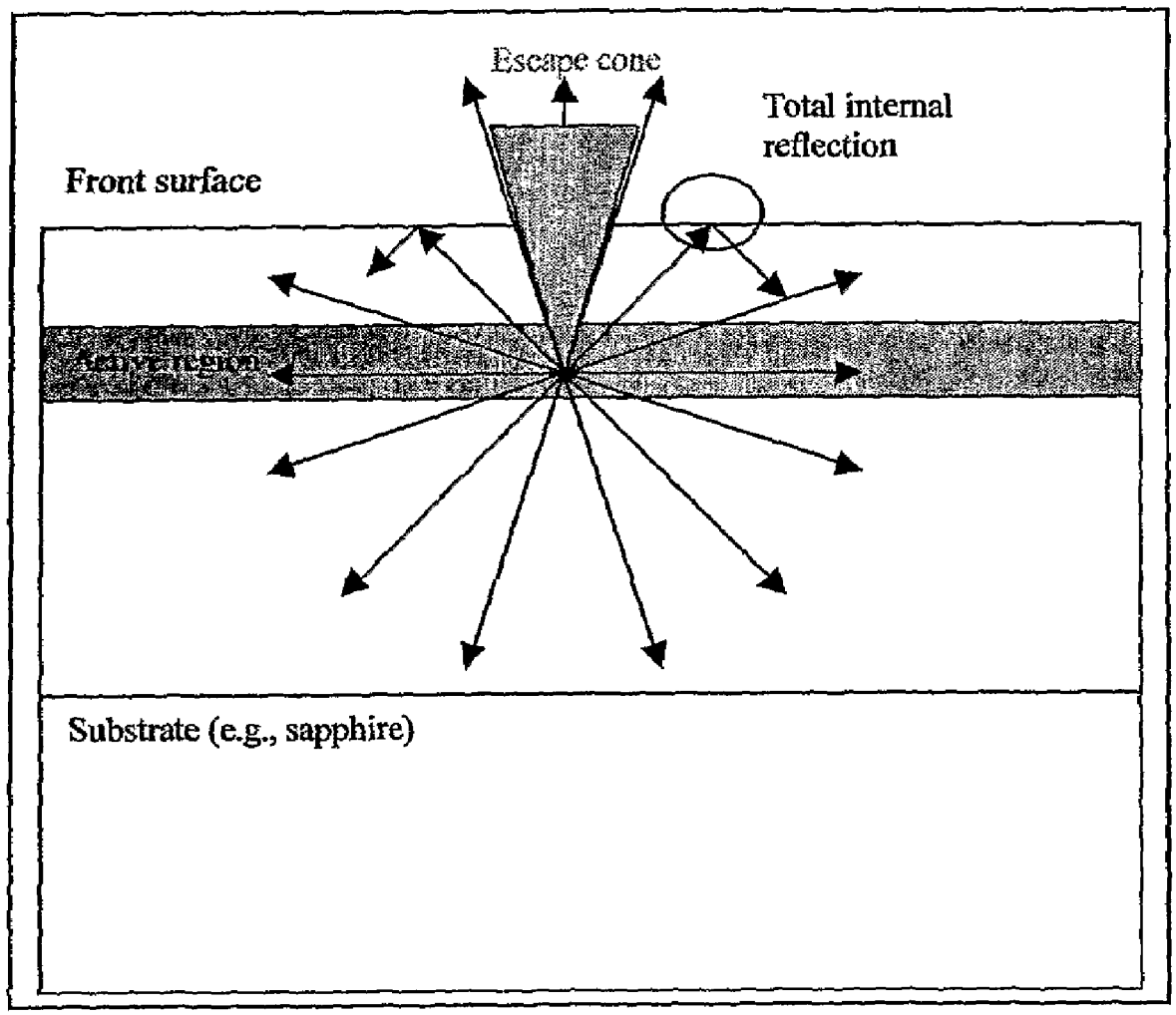
FIG. 1 is a schematic representation of light escaping from a semiconductor device.
Figure 2:
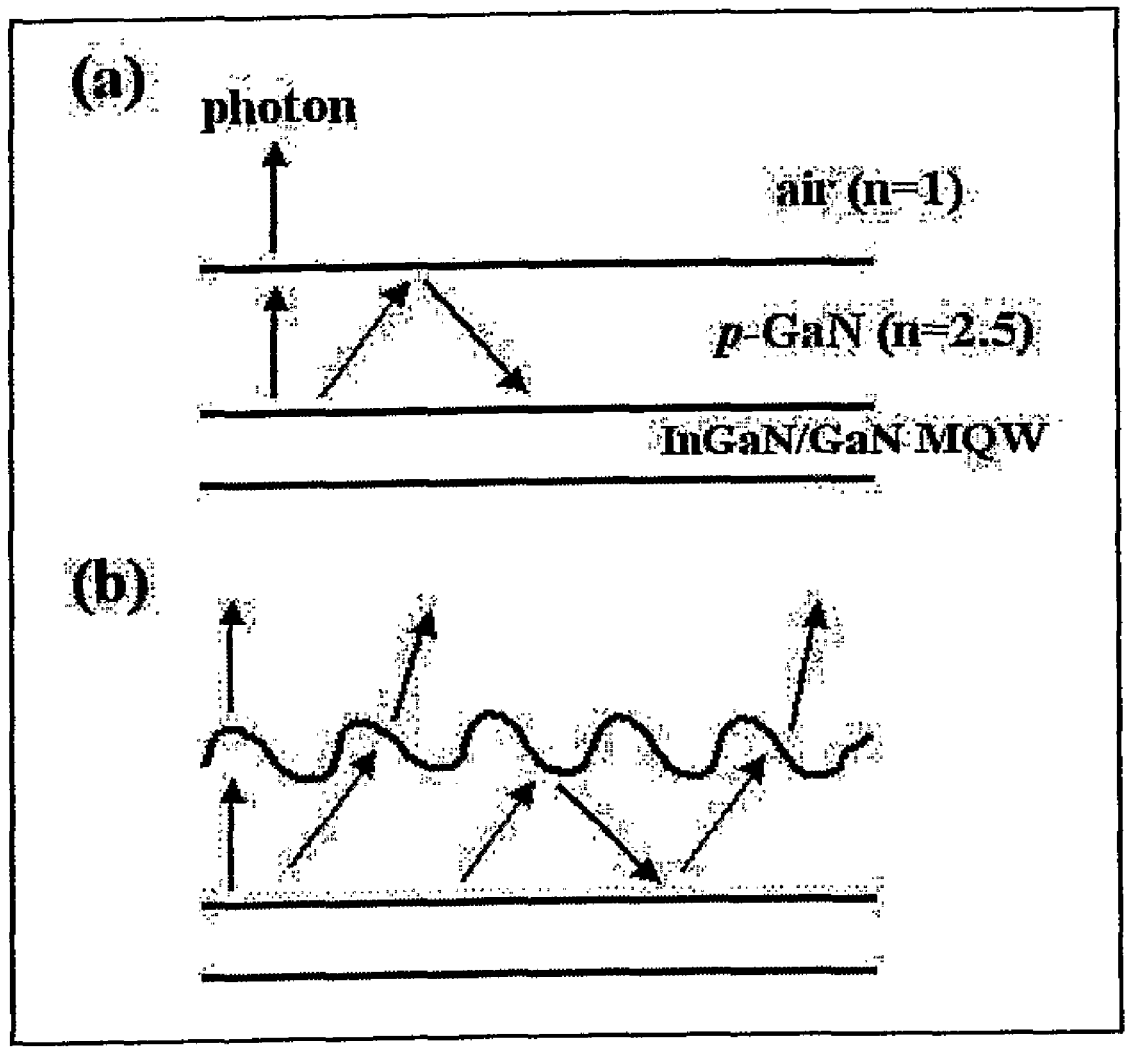
FIG. 2 is an illustration of photons generated within the semiconductor device of FIG. 1 being given multiple opportunities to find the escape cone.
Figure 3:
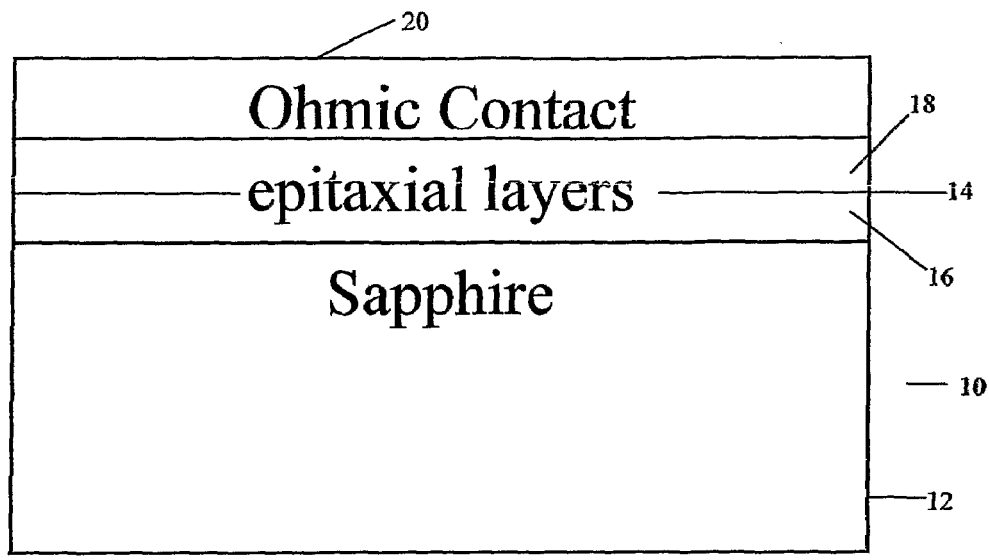
FIG. 3 is a schematic representation of a semiconductor device at a first stage in the fabrication process.

To refer to FIG. 3, there is shown the first step in the process—the metallization on the p-type surface of the wafer 10.

The wafer 10 is an epitaxial wafer with a substrate 12 and a stack of multiple epitaxial layers 14 on it. The substrate 12 can be, for example, sapphire, GaAs, InP, Si, and so forth. Henceforth a GaN sample having GaN layer(s) 14 on sapphire substrate 12 will be used as an example. The epitaxial layers 14 (often called epilayers) are a stack of multiple layers, and the lower surface 16 (which is grown first on the substrate) is usually n-type layers and the upper part 18 is often p-type layers. An active region is often sandwiched between 16 and 18, and is often made of quantum wells (QWs) or multiple quantum wells (MQWs) that are often not intentionally doped. A quantum well is usually a stack of at least three layers. For example, for GaN LEDs, the multiple quantum wells are often GaN/InGaN/GaN or AlGaN/GaN/AlGaN multiple layers.

On the front surface of GaN layers 14 is an ohmic contact layer 20 having multiple metal layers. The ohmic contact layer 20 also acts as a reflector or mirror at the interface with the epitaxial layers 14. Therefore, light generated in the active region in epitaxial layers 14 is reflected towards the rear surface 16 of epitaxial layers—the rear surface 16 being that which interfaces with substrate 12. To ohmic contact layer 20 is added an adhesion layer 22, and a thin copper seed layer 24 (FIG. 4) (step 87) of a thermally conductive metal such as, for example, copper. The thermally conductive metal is preferably also electrically conductive. The stack of adhesion layers may be annealed after formation.

The ohmic layer 20 may be a stack of multiple layers deposited and annealed on the semiconductor surface. It may not be part of the original wafer. For GaN, GaAs, and InP devices, the epitaxial wafer often contains an active region that is sandwiched between n-type and p-type semiconductors. In most cases the top layer is p-type. For silicon devices, epitaxial layers may not be used, but just the wafer.

Figure 5:
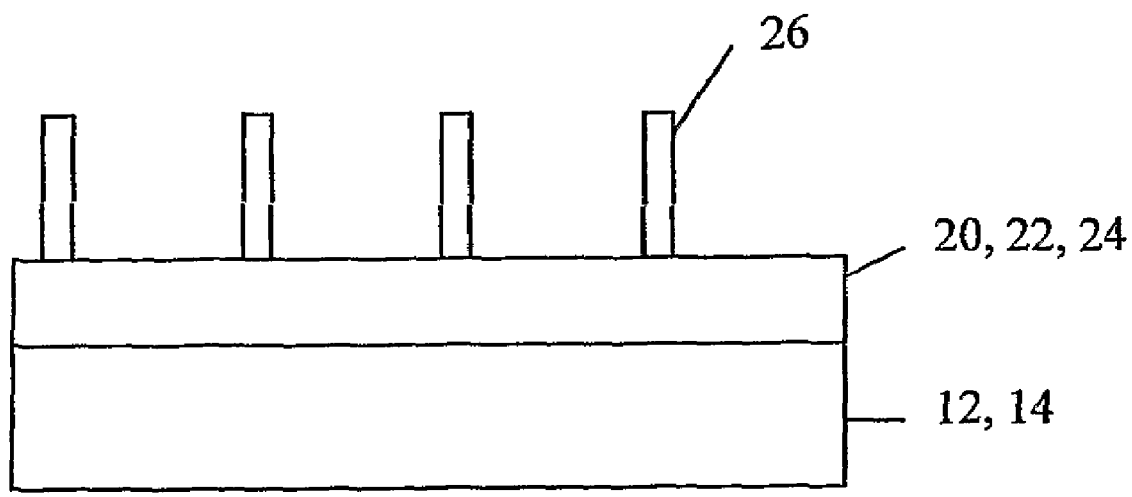
FIG. 5 is a schematic representation of the semiconductor device of FIG. 3 at a third stage in the fabrication process.

As shown in FIG. 5, using standard photolithography (88), the thin copper seed layer 24 is patterned with relatively thick photoresists 26. The photoresist patterns 26 are preferably of a height in the range of 3 to 500 micrometers, preferably 15 to 500 micrometers; and with a thickness of about 3 to 500 micrometers. They are preferably separated from each other by a spacing in the range of 200 to 2,000 microns, preferably 300 microns, depending on the design of the final chips. The actually pattern depends on device design.

Figure 6:
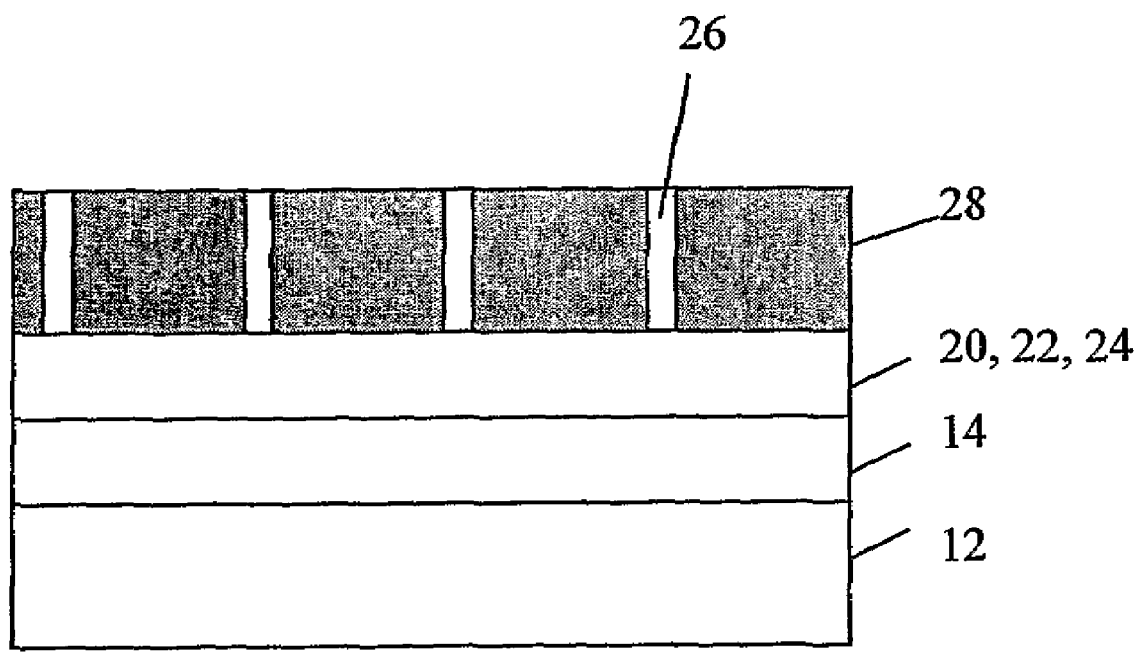
FIG. 6 is a schematic representation of the semiconductor device of FIG. 3 at a fourth stage in the fabrication process.

A patterned layer 28 of copper is then electroplated onto layer 24 (90) between photoresists 26 to form a heat sink that forms a part of the new substrate (FIG. 6). The copper layer 28 is preferably of a height no greater than that of the photoresists 26 and is therefore of the same or lesser height than the photoresists 26. However, the copper layer 28 may be of a height greater than that of the photoresists 26. In such a case, the copper layer 28 may be subsequently thinned to be of a height no greater than that of the photoresists 26. Thinning may be by polishing or wet etching. The photoresists 26 may or may not be removed after the copper plating. Removal may be by a standard and known method such as, for example, rinsing in the resist stripper solution, or by plasma aching.

Figure 4:
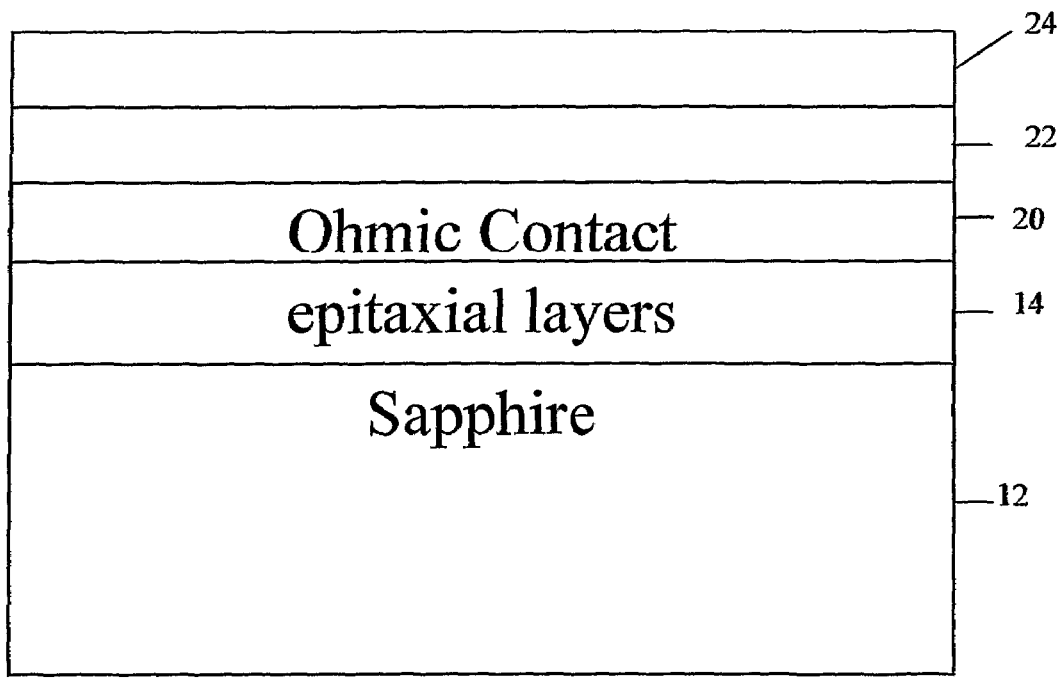
FIG. 4 is a schematic representation of the semiconductor device of FIG. 3 at a second stage in the fabrication process.

Depending on the device design, processing of the epitaxial layers 14 follows using standard processing techniques such as, for example, cleaning (80), lithography (81), etching (82), device isolation (83), passivation, metallization (86), thermal processing (86), and so forth. (FIG. 4). The wafer 10 is then annealed (87) to improve adhesion.

The epitaxial layer 14 is usually made of n-type layers 16 on the original substrate 12; and p-type layers on the original top surface 18 which is now covered with the ohmic contact layer 20, adhesion layer 22, copper seed layer 24, and the electroplated thick copper layer 28.

Figure 7:
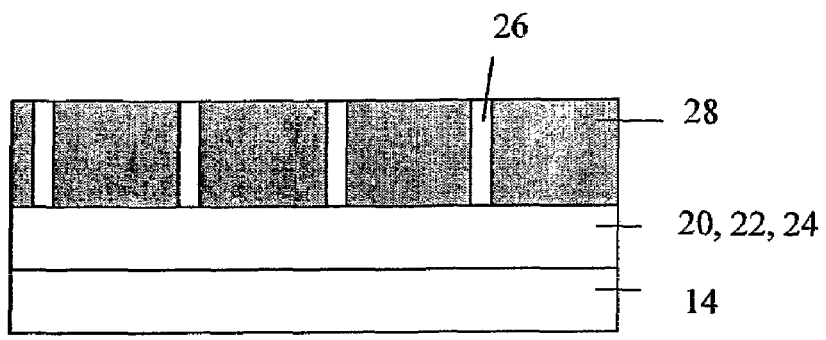
FIG. 7 is a schematic representation of the semiconductor device of FIG. 3 at a fifth stage in the fabrication process.
Figure 8:
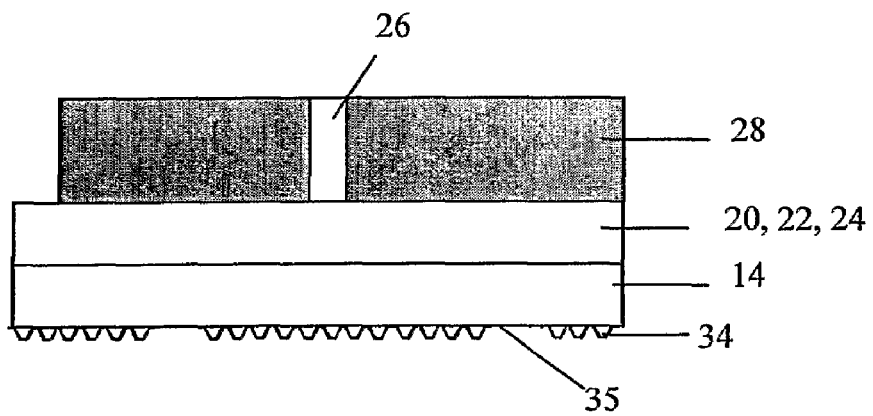
FIG. 8 is a side view of the semiconductor device of FIG. 7.
Figure 9:
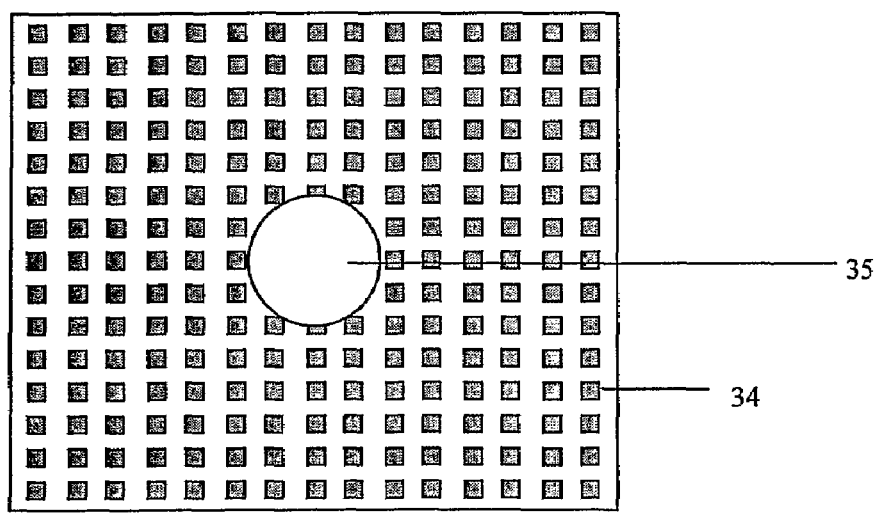
FIG. 9 is an underneath view of a single die produced from the semiconductor device of FIGS. 7 and 8.
Figure 10:
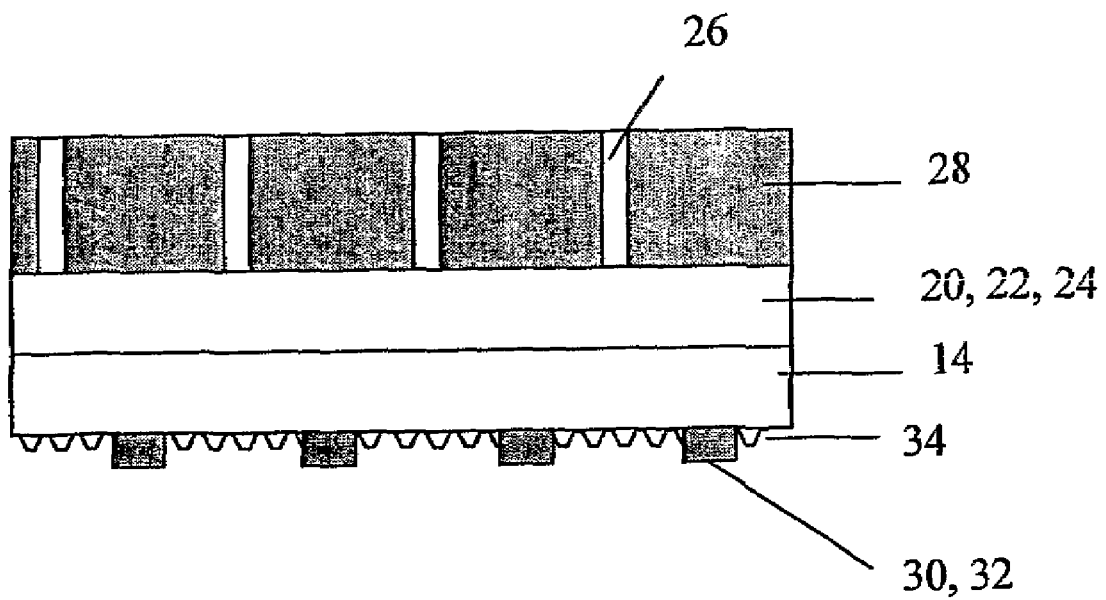
FIG. 10 is a schematic representation of the semiconductor device of FIG. 3 at a sixth stage in the fabrication process.

In FIG. 7, the original substrate layer 12 is then removed (91) using, for example, the method of Kelly [M. K. Kelly, O. Ambacher, R. Dimitrov, R. Handschuh, and M. Stutzmann, phys. stat. sol. (a) 159, R3 (1997)]. The substrate may also be removed by polishing or etching. If a sacrificial layer is grown between the substrate and the epitaxial layers, after growth the substrate can be separated from the epitaxial layers with separation being automatic, or by mechanical force.

Known preliminary processes may then be performed. These may be, for example, photolithography (92, 93), dry etching (94) surface texturing of the rear surface 34 (95) and photolithography (96). The surface texturing (95) forms a textured rear surface 34.

FIG. 7 is the penultimate step. After the removal of the substrate 12, surface texturing is carried out on the now-exposed rear surface 14 thereby forming the surface patterns 34. The center part 35 of the rear surface is also etched for subsequent deposition of the second ohmic contact 30. The centre area 35 does not have to be etched, if desired or required. Bonding pads 32 are also added to the second ohmic contact 30. The second ohmic contact layer 30 is preferably a thin layer, or a stack of multiple metal layers and may be in the range of 3 to 50 nm thick.

Annealing (98) may follow the deposition of ohmic contact layer 30, or after the deposition of bond pad 32.

Figure 11:
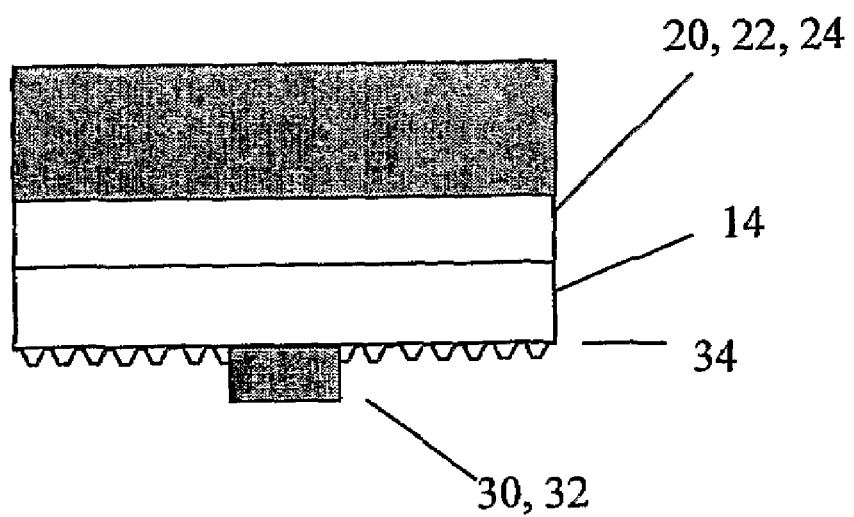
FIG. 11 is a side view of the semiconductor device of FIG. 10.

The chips/dies are then tested (99) by known and standard methods. The chips/dies can then be separated (100) (FIG. 11) into individual devices/chips without lapping/polishing the substrate, and without dicing. Packaging follows by standard and known methods.

The front surface of the epitaxial layer 14 is preferably in the range of about 0.1 to 2.0 microns, preferably about 0.3 microns, from the active region. For silicon-based semiconductors, the top surface of the semiconductor is preferably in the range 0.1 to 2.0 microns, preferably about 0.3 microns, from the device layer. As the active layer/device layer in this configuration is close to a relatively thick copper pad 28, the rate of heat removal is improved.

Additionally or alternatively, the relatively thick layer 28 may be used to provide mechanical support for the chip. It may also be used to provide a path for heat removal from the active region/device layer, and may also be used for electrical connection.

The plating step is performed at the wafer level (i.e., before the dicing operation) and may be for several wafers at the one time.

The fabrication of GaN laser diodes is similar to the fabrication of GaN LEDs, but more steps may be involved. One difference is that GaN laser diodes require mirror formation during the fabrication. Using sapphire as the substrate compared to the method without sapphire as the substrate, the mirror formation is much more difficult and the quality of the mirror is generally worse.

The first ohmic contact layer 20, being metal and relatively smooth, is quite shiny and therefore highly reflective of light. As such the first ohmic contact layer 20, at its junction with the epitaxial layers 14, also is a reflective surface, or mirror, to improve light output. Light output is through textured surface 34.

In this way the textured surface 34 is fabricated on the rear surface being the surface to which the sapphire was previously attached, and the reflective layer is fabricated on the front surface of the relatively smooth epitaxial layers. Light emission is through the rear, textured surface 34, and reflection is at the top or front surface. This is the reverse of normal. In this way the original top layer 18 may be of a thickness such as that of an ordinary LED, for example, 0.1 μm, and the depth of the texturing of surface 34 may be within a wide range such as, for example, from 0.01 μm to 2 μm.

If the surface texturing is on the rear surface and is formed after the substrate is removed, the problems of the prior art may be largely avoided, as the total thickness of the layers between the sapphire substrate and the active region often exceeds 3 microns (3000 nm), thus the formation of the surface patterns should not noticeably affect the active region.

For the surface texturing to have significant effect on light extraction efficiency, the quality of the reflection mirror is important, as the mirrors increase the opportunities for the light to find the escape cone. If the mirror is placed at the front surface, the substrate if removed, and then surface texturing is done on the newly-exposed rear surface, the reflection of the light is significantly improved, as the distance between the front mirror and the rear surface is relatively low—normally of the order of a few microns. If the substrate is not removed, as in most cases, mirrors are often formed on the back of the substrate, while surface texturing is done on the front surface, the distance between them is thus hundreds of microns. When light travels a large distance between the front and back, there is a high loss of light by absorption.

Although reference is made to copper, any other platable material may be used provided it is electrically and/or heat conductive, or provides the mechanical support for the semiconductor device.

The texturing of the rear surface may be by standard patterning methods. For example, it may be by patterning the exposed rear surface and then etching. Etching may be by one or more of: dry etching, wet etching, photochemical etching, laser etching, or other suitable methods. The texturing may also be by photolithography followed by deposition of a layer on the exposed rear surface and then lift-off.

As taught by Huh et al, (J. Appl. Phys. 93, page 9383, 2003), texturing may also be by depositing a thin metal film on the rear surface, and then rapid thermal annealing of the metal to form a cluster of metal drops which is then used as an etching mask for the surface texturing. Texturing may be performed on the deposited dielectric film(s), instead of the rear surface.

If the second ohmic contact layer covers large portion of the rear surface, the texturing step may be formed directly on the second ohmic contact. In this way the patterned second ohmic contact layer serves as the textured surface.

The substrate may be patterned before the deposition of the epitaxial layers on the substrate. Therefore, after the removal of the substrate, the rear surface is already patterned and thus no subsequent rear surface texturing is required.

It is also possible to pattern or texture the layers below the active region during the deposition of the plurality of epitaxial layers. In this way the patterns are already in the layered structure before the substrate is removed, although the texture is not at the rear surface. Such patterning may improve the extraction efficiency of the LED after the substrate is removed.

Whilst there has been described in the foregoing description a preferred form of the present invention, it will be understood by those skilled in the technology that many variations or modifications in design, construction or operation may be made without departing from the present invention.

The invention claimed is:

1. A method for fabrication of a semiconductor device, the semiconductor device having a plurality of epitaxial layers on a substrate, the plurality of epitaxial layers including an active region in which light is able to be generated, the method comprising:
   (a) applying at least one first ohmic contact layer to a front surface of the epitaxial layer, the first ohmic contact layer also acting as a reflector;
   (b) removing the substrate from a rear surface of the epitaxial layers; and
   (c) texturing the rear surface.

2. A method as claimed in claim 1, wherein before the substrate is removed a relatively thick layer of the thermally conductive metal is electroplated on the reflector layer.

3. A method as claimed in claim 2, wherein the relatively thick layer is of a height no greater that the photoresist height.

4. A method as claimed in claim 2, wherein the relatively thick layer of thermally conductive metal is electroplated to a height greater than the photoresist and is subsequently thinned; thinning being by polishing or wet etching.

5. A method as claimed in claim 2, wherein after the relatively thick layer is applied, ohmic contact formation and subsequent process steps are carried out, the subsequent process steps including deposition of wire bond pads.

6. A method as claimed in claim 1, wherein before the substrate is removed, a seed layer of a thermally conductive metal is applied to the ohmic contact layer, and a relatively thick layer of the thermally conductive metal is electroplated on the seed layer.

7. A method as claimed in claim 6, wherein the front surface is coated prior to application of the seed layer, the coating being one or more of: an adhesion layer, and a multiple layer stack.

8. A method as claimed in claim 6, wherein a patterned layer is added to the seed layer before the electroplating step, and the electroplating of the relatively thick layer is between the patterns.

9. A method as claimed in claim 8, wherein the patterned layer comprises photoresist patterns.

10. A method as claimed in claim 6, wherein the seed layer is patterned before the electroplating step, and the electroplating of the relatively thick layer is between the patterns.

11. A method as claimed in claim 10, wherein the pattern on the seed layer comprises photoresist patterns.

12. A method as claimed in claim 6, wherein the seed layer is electroplated without patterning, patterning before performed subsequently, patterning being by one selected from the group consisting of: photoresist patterning and then wet etching, and laser beam micro-machining of the relatively thick layer.

13. A method as claimed in claim 1, wherein before removing the substrate annealing is performed to improve adhesion.

14. A method as claimed in claim 1, wherein the texturing step (c) is by at least one method selected from the group consisting of:
   (a) patterning the rear surface and then etching,
   (b) photolithography followed by deposition of a layer on the rear surface and then lift-off, and
   (c) by depositing a thin metal film on the rear surface and then rapid thermal annealing of the metal to form a cluster of metal drops that is used as an etching mask for the texturing.

15. A method as claimed in claim 14, wherein etching is by one or more of the methods selected from the group consisting of: dry etching, wet etching, photochemical etching, and laser etching.

16. A method as claimed in claim 1, wherein the texturing is of a shape and dimensions able to be varied.

17. A method as claimed in claim 1, wherein after removing the substrate in step (b), the rear surface is etched and the rear surface is then textured.

18. A method as claimed in claim 1, wherein after the substrate is removed in step (b), at least one layer added to the rear surface and the at least one layer is textured.

19. A method as claimed in claim 1, wherein there is included an extra step of forming a second ohmic contact layer on the rear surface, the second ohmic contact layer being selected from the group consisting of: opaque, transparent, and semi-transparent, the extra step being performed at one of: after step (c), and between steps (b) and (c).

20. A method as claimed in claim 19, wherein the second ohmic contact layer is one of blank and patterned, and bonding pads are formed on the second ohmic contact layer.

21. A method as claimed in claim 19, wherein the exposed second surface is cleaned and etched before the second ohmic contact layer is deposited, and the second ohmic contact layer does not cover the whole area of the rear surface.

22. A method as claimed in claim 21, wherein the second ohmic contact layer covers large portion of the rear surface, and step (c) is performed directly on the second ohmic contact layer and the second ohmic contact layer is the textured surface.

23. A method as claimed in claim 19, wherein there is included the step of separation into individual devices.

24. A method as claimed in claim 1, wherein the semiconductor devices are fabricated without one or more selected from the group consisting of: lapping, polishing and dicing.

25. A method as claimed in claim 1, wherein the at least one first ohmic contact layer is on p-type layers of the epitaxial layers, and the second ohmic contact layer is formed on n-type layers of the epitaxial layers.

26. A method as claimed in claim 1, wherein after step (c), dielectric films are deposited on the epitaxial layers and openings are cut in the dielectric films and second ohmic contact layer, and bond pads deposited on the epitaxial layers.

27. A method as claimed in claim 1, wherein after step (c), electroplating of a thermally conductive metal on the epitaxial layers is performed.

28. A method as claimed in claim 27, wherein the thermally conductive metal comprises copper and the epitaxial layers comprise multiple GaN-related layers.

29. A method as claimed in 28, wherein step (c) is performed in the deposited dielectric film(s) instead of the rear surface.

30. A method for fabrication of a semiconductor device, the semiconductor device having a plurality of epitaxial layers on a substrate, the plurality of epitaxial layers including an active region in which light is able to be generated, the method comprising:
   (a) patterning the substrate prior to the deposition of the plurality of epitaxial layers on the substrate;

(b) applying at least one first ohmic contact layer to a front surface of the plurality of epitaxial layers, the first ohmic contact layer also acting as a reflector; and (c) removing the substrate from a rear surface of the epitaxial layers such that after the removal of the substrate, the rear surface is already patterned.

31. A method as claimed in claim 30, wherein after removal of the substrate no subsequent rear surface texturing is required.

32. A method for fabrication of a semiconductor device, the semiconductor device having a plurality of epitaxial layers on a substrate, the plurality of epitaxial layers including an active region in which light is able to be generated, the method comprising:

(a) patterning the plurality of epitaxial layers below the active region during the deposition of the plurality of epitaxial layers;

(b) applying at least one first ohmic contact layer to a front surface of the plurality of epitaxial layers, the first ohmic contact layer also acting as a reflector; and (c) removing the substrate.

33. A method for fabrication of a semiconductor device, the semiconductor device having a plurality of epitaxial layers on a substrate, the plurality of epitaxial layers including an active region in which light is able to be generated, the method comprising:

(a) applying at least one first ohmic contact layer to a front surface of the epitaxial layer, the first ohmic contact layer also acting as a reflector;

(b) removing the substrate from a rear surface of the epitaxial layers;

(c) depositing dielectric films on the epitaxial layers; and (d) texturing the dielectric films.

34. A semiconductor device comprising epitaxial layers, first ohmic contact layers on a front surface of the epitaxial layers and providing a reflective surface, and a second ohmic contact layer on a rear surface of the epitaxial layers; the rear surface being surface textured.

35. A semiconductor device as claimed in claim 34, further comprising a relatively thick layer of a thermally conductive metal on the first ohmic contact layer, there being an adhesive layer on the first ohmic contact layer between the first ohmic contact layer and the relatively thick layer.

36. A semiconductor device as claimed in claim 35, wherein there is a seed layer of the thermally conductive metal applied to the adhesive layer.

37. A semiconductor device as claimed in claim 34, wherein the second ohmic contact layer is selected from the group consisting of: opaque, transparent, and semi-transparent.

38. A semiconductor device as claimed in claim 34, wherein the second ohmic layer includes bonding pads.

39. A semiconductor device as claimed in claim 34, wherein the thermally conductive metal is copper and the epitaxial layers comprise multiple GaN-related epitaxial layers.

40. A semiconductor device as claimed in claim 34, wherein the semiconductor device is selected from the group consisting of: a light emitting device, and a transistor device.

41. A semiconductor device as claimed in claim 34, wherein the second ohmic contact layer is selected from the group consisting of: blank, and patterned.

* * * * *